United States Patent
Lansford et al.

(10) Patent No.: US 7,456,110 B2
(45) Date of Patent: Nov. 25, 2008

(54) METHOD AND APPARATUS FOR CONTROLLING ETCH SELECTIVITY

(75) Inventors: Jeremy S. Lansford, Austin, TX (US); Laura Faulk, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 63 days.

(21) Appl. No.: 10/996,034

(22) Filed: Nov. 23, 2004

(65) Prior Publication Data

US 2005/0098535 A1 May 12, 2005

Related U.S. Application Data

(63) Continuation of application No. 09/783,423, filed on Feb. 14, 2001, now abandoned.

(51) Int. Cl.
*H01L 21/302* (2006.01)
(52) U.S. Cl. .......................... 438/706; 438/714; 216/72
(58) Field of Classification Search ................ 438/706, 438/710, 712, 714, 719, 720, 723, 724, 725, 438/9; 216/59, 72
See application file for complete search history.

(56) References Cited

U.S. PATENT DOCUMENTS

| | | | | |
|---|---|---|---|---|
| 4,687,543 A | * | 8/1987 | Bowker | 438/733 |
| 5,372,673 A | | 12/1994 | Stager et al. | 156/626 |
| 5,620,556 A | * | 4/1997 | Henck | 438/8 |
| 5,661,669 A | * | 8/1997 | Mozumder et al. | 702/84 |
| 5,741,396 A | * | 4/1998 | Loewenstein | 438/724 |
| 5,770,098 A | * | 6/1998 | Araki et al. | 216/67 |
| 5,795,493 A | | 8/1998 | Bukhman et al. | 216/59 |
| 6,074,959 A | * | 6/2000 | Wang et al. | 438/738 |
| 6,133,132 A | | 10/2000 | Toprac et al. | 438/595 |
| 6,136,712 A | * | 10/2000 | Klippert, II et al. | 438/692 |

(Continued)

FOREIGN PATENT DOCUMENTS

JP 10209117 8/1998

(Continued)

OTHER PUBLICATIONS

International Search Report dated Jan. 16, 2003 (PCT/US02/02235).

*Primary Examiner*—Kin-Chan Chen
(74) *Attorney, Agent, or Firm*—Williams, Morgan & Amerson, P.C.

(57) ABSTRACT

A method for controlling an etch process comprises providing a wafer having at least a first layer and a second layer formed over the first layer. The thickness of the second layer is measured. An etch selectivity parameter is determined based on the measured thickness of the second layer. An operating recipe of an etch tool is modified based on the etch selectivity parameter. A processing line includes an etch tool, a first metrology tool, and a process controller. The etch tool is adapted to etch a plurality of wafers based on an operating recipe, each wafer having at least a first layer and a second layer formed over the first layer. The first metrology tool is adapted to measure a pre-etch thickness of the second layer. The process controller is adapted to determine an etch selectivity parameter based on the measured pre-etch thickness of the second layer and modify the operating recipe of the etch tool based on the etch selectivity parameter.

21 Claims, 2 Drawing Sheets

U.S. PATENT DOCUMENTS

| | | | | |
|---|---|---|---|---|
| 6,148,239 A | * | 11/2000 | Funk et al. | 700/1 |
| 6,333,271 B1 | * | 12/2001 | Chiu et al. | 438/706 |
| 6,500,681 B1 | * | 12/2002 | Christian et al. | 438/8 |
| 6,635,185 B2 | * | 10/2003 | Demmin et al. | 216/64 |

FOREIGN PATENT DOCUMENTS

| | | |
|---|---|---|
| TW | 405204 | 9/2000 |
| WO | WO 00/79355 | 12/2000 |

* cited by examiner

METHOD AND APPARATUS FOR CONTROLLING ETCH SELECTIVITY

CROSS REFERENCE TO RELATED APPLICATIONS

This application is a continuation of and claims priority to U.S. patent application Ser. No. 09/783,423, filed Feb. 14, 2001, now abandoned.

BACKGROUND OF THE INVENTION

1. Field of the Invention

This invention relates generally to the field of semiconductor device manufacturing and, more particularly, to a method and apparatus for controlling etch selectivity.

2. Description of the Related Art

There is a constant drive to reduce the size, or scale, of semiconductor devices, such as transistors, to increase the overall speed of the device incorporating such transistors. A conventional integrated circuit device, such as a microprocessor, is typically comprised of many millions of transistors formed above the surface of a semiconductive substrate.

Many modern integrated circuit devices are very densely packed, i.e., there is very little space between the transistors formed above the substrate. The manufacture of semiconductor devices requires a number of discrete process steps to create a packaged semiconductor device from raw semiconductor material. The various processes include the initial growth of the semiconductor material, the slicing of the semiconductor crystal into individual wafers, the fabrication stages (etching, doping, ion implanting, or the like), and the packaging and final testing of the completed device.

Among the important aspects in semiconductor device manufacturing are rapid thermal annealing (RTA) control, chemical-mechanical polishing (CMP) control, etch control, and overlay control. As technology advances facilitate smaller critical dimensions for semiconductor devices, the need for reduction of errors increases dramatically. Proper formation of sub-sections within a semiconductor device is an important factor in ensuring proper performance of the manufactured semiconductor device. Critical dimensions of the sub-sections generally have to be within a predetermined acceptable margin of error for semiconductor devices to be within acceptable manufacturing quality.

Generally, most features on a semiconductor device are formed by depositing layers of material (e.g., conductive or insulative) and patterning the layers using photolithography and etch processes. There are many variables that affect the accuracy and repeatability of the etch processes used to form the features. One particular etch process involves a plasma etch that removes a portion of an upper layer formed on the wafer. Although the plasma etch is primarily an anisotropic etch, it does have an isotropic component. During the etch, reactants in the plasma form a polymer byproduct that deposits on the surfaces exposed to the plasma, including the features being etched. Polymer that forms on sidewalls of the feature being etched is not removed by the anisotropic component of the etch. Typically, a halocarbon gas (i.e., containing a halogen such as chlorine or fluorine and a hydrocarbon group) is used in the etch process. Ions of hydrocarbon groups are generated in the plasma and accelerated toward the surface of the wafer to perform the anisotropic etch. The anisotropic etch component also removes the polymer buildup on the surfaces perpendicular to the ion flux. Halogenated radicals, also generated in the plasma, have an isotropic chemical etching effect that removes the surface film where the polymer has been "sputtered" away. The isotropic etch component also affects the sidewall surfaces, but to a lesser degree than the more "flat" surfaces.

After the desired layer has been removed, the plasma etch process typically etches the underlying layer to some degree. For example, during the formation of a transistor, a polysilicon layer is formed over a silicon dioxide layer. The polysilicon is subsequently etched using an anisotropic plasma etch to form a transistor gate electrode. The silicon dioxide is also partially etched during the etching of the polysilicon. Similar etching of the underlying layer is also evident in plasma etches of silicon nitride over silicon dioxide, for example. Variations in the incoming thickness of the upper and underlying layers and in the selectivity of the upper and underlying layers to the plasma etch process (i.e., etch rates for the different materials in the upper and underlying layers are different) result in deviations in the post-etch thickness of the underlying layer from a target post-etch thickness. These post-etch thickness deviations, in turn, may cause corresponding variations in the properties of the device and its performance. Minimizing post-etch thickness variations is particularly important in the formation of features such as polysilicon gate electrodes and local interconnect structures.

The present invention is directed to overcoming, or at least reducing the effects of, one or more of the problems set forth above.

SUMMARY OF THE INVENTION

One aspect of the present invention is seen in a method for controlling an etch process. The method comprises providing a wafer having at least a first layer and a second layer formed over the first layer. The thickness of the second layer is measured. An etch selectivity parameter is determined based on the measured thickness of the second layer. An operating recipe of an etch tool is modified based on the etch selectivity parameter.

Another aspect of the present invention is seen in a processing line including an etch tool, a first metrology tool, and a process controller. The etch tool is adapted to etch a plurality of wafers based on an operating recipe, each wafer having at least a first layer and a second layer formed over the first layer. The first metrology tool is adapted to measure a pre-etch thickness of the second layer. The process controller is adapted to determine an etch selectivity parameter based on the measured pre-etch thickness of the second layer and modify the operating recipe of the etch tool based on the etch selectivity parameter.

BRIEF DESCRIPTION OF THE DRAWINGS

The invention may be understood by reference to the following description taken in conjunction with the accompanying drawings, in which like reference numerals identify like elements, and in which.

Figure 1:
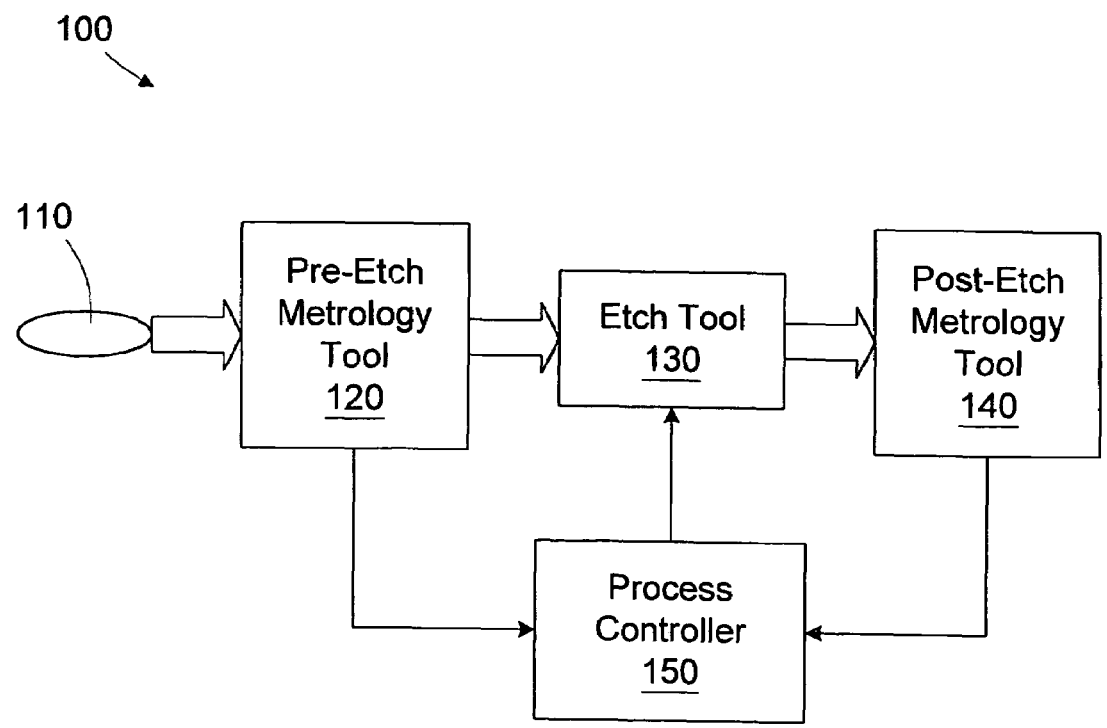
FIG. 1 is a simplified block diagram of a processing line in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to FIG. 1, a simplified diagram of a portion of an illustrative processing line 100 for processing wafers 110 in accordance with the present invention is provided. The processing line 100 includes a pre-etch metrology tool 120, an etch tool 130, a post-etch metrology tool 140, and a process controller 150. The process controller 150 receives data from the metrology tools 120, 140 and adjusts the operating recipe of the etch tool 130 to control etch selectivity and thereby reduce variations in the post-etch characteristics of the processed wafers 110.

An exemplary tool suitable for performing the functions of the etch tool 130 is a Rainbow 9400 plasma etch tool offered by Lam Research. The metrology tools 120, 140 are thickness measurement tools, such as Optiprobe thickness measuring tools offered by Thermawave, Inc. Although, distinct metrology tools 120, 140 are illustrated, a single tool may be used for the pre-etch and post-etch measurements. The metrology tools 120, 140 may be integrated with the etch tool 130. The process controller 150 contains an etch selectivity model of the etch tool 130. The model may be generated and/or updated based on input from the metrology tools 120, 140 of the actual pre-etch and post-etch thicknesses of an upper layer being etched and an underlying layer formed beneath the upper layer. There are many possible combinations of material for the upper layer and the underlying layer. Exemplary upper and underlying layer material pairs are polysilicon and silicon dioxide, silicon dioxide and silicon nitride, silicon nitride and silicon dioxide, etc.

In the illustrated embodiment, the process controller 150 is a computer programmed with software to implement the functions described. However, as will be appreciated by those of ordinary skill in the art, a hardware controller designed to implement the particular functions may also be used. Moreover, the functions performed by the process controller 150, as described herein, may be performed by multiple controller devices distributed throughout a system. Additionally, the process controller 150 may be a stand-alone controller, it may be resident on the etch tool 130, or it may be part of a system controlling operations in an integrated circuit manufacturing facility. Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the process controller 140 as described is the Catalyst system offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

The pre-etch metrology tool 120 measures the incoming thicknesses of the upper and underlying layers and provides the pre-etch thickness measurements to the process controller 150. Based on the pre-etch thickness measurements, the process controller 150 generates operating recipe parameters for controlling the etch selectivity of the etch tool 130. Controlling the etch selectivity controls the etch rates of the etch tool 130 for the materials of the upper and underlying layers, thus affecting their post-etch thicknesses. Post-etch thickness measurements provided by the post-etch metrology tool 140 may be used to update the etch selectivity model used by the process controller 150 to determine the operating recipe of the etch tool 130.

Exemplary factors that affect etch selectivity are temperature, pressure, and reactant gas composition. Generally, as temperature increases, less polymer byproduct is formed by the plasma reactants. This decrease in byproduct formation typically increases the isotropic etch rate of the plasma. As pressure is decreased, the energy of the ions increases, causing the polymer forming on the surfaces perpendicular to the etch to be removed more quickly. As a result, the anisotropic etch rate is increased.

A typical plasma reactive gas mixture includes one or more halocarbon gases, such as $C_2F_8$, $C_4F_8$, $CHF_3$, $CF_4$, $CCl_4$, etc. Many other halocarbon gases are commonly used. The etch selectivity may be controlled by changing the ratio of halocarbon gas concentrations in the plasma. For example, consider a plasma including $CHF_3$ and $CF_4$. In an example application, a silicon dioxide layer is formed by a TEOS deposition process, followed by a spin-on-glass (SOG) deposition and cure. The dielectric that is formed receives a planarization etch, where both the TEOS and SOG are exposed to the etching plasma. The relative etch rates of these films determine the degree of planarization of the resulting structure. By keeping the total flow rate of $CHF_3$ and $CF_4$ equal and varying the ratio of the two gases, the selectivity can be optimized. Increasing the ratio of $CF_4$ flow to $CHF_3$ flow increases the etchrate of TEOS relative to SOG. Likewise, decreasing the ratio increases the relative SOG etchrate. In an etching process with a higher $CHF_3$ concentration, the rate of polymer formation is increased.

In changing the recipe of the etch tool 130, the process controller 150 may change a parameter or parameters within a baseline recipe or, alternatively, the process controller 150 may provide an entirely new recipe. The process controller 150 may update the recipe on a wafer-to-wafer basis, a lot-to-lot basis, or for each group of lots simultaneously processed in a single load.

The process controller 150 may change the recipe of the etch tool 130 in a feedback mode or in a feedforward mode of operation. In a feedback mode, the thickness measurements from the metrology tools 120, 140 may be used in conjunction with a target post-etch thickness to determine a new operating recipe for subsequently processed wafers. In a feedforward mode, the process controller 150 may receive incoming thickness measurements from the pre-etch metrology tool 120 and predict operating recipe parameters for controlling the etch selectivity. Subsequent post-etch measurements may be used to update the predictive model for subsequent wafers.

An etch selectivity model may be generated by the process controller 150, or alternatively, it may be generated by a different processing resource (not shown) and stored on the process controller 150 after being developed. The etch selectivity model may be developed using the etch tool 130 or using a different tool (not shown) having similar operating characteristics. For purposes of illustration, it is assumed that the etch selectivity model is generated and updated by the process controller 150 or other processing resource based on actual performance of the etch tool 130 as measured by the metrology tools 120, 140. The etch selectivity model is trained based on historical data collected from numerous processing runs of the etch tool 130. The etch selectivity model may be a relatively simple equation based model (e.g., linear, exponential, weighted average, etc.) or a more complex model, such as a neural network model, principal component analysis (PCA) model, or a projection to latent structures (PLS) model. The specific implementation of the model may vary depending on the modeling technique selected, and such specific implementation is well known to those of ordinary skill in the art.

The following example is provided as a high-level illustration of how an etch selectivity model of the etch tool 130 may be generated. The specific implementation of the etch selectivity model may vary depending on the modeling technique selected, and such specific implementation is well known to those of ordinary skill in the art. Thus, for clarity and ease of illustration, such specific details are not described in greater detail herein.

Figure 2:
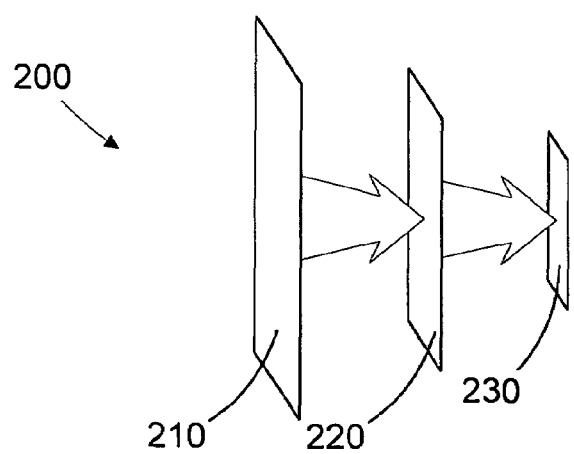
FIG. 2 is a simplified diagram of a neural network modeling system in accordance with one embodiment of the present invention.

Turning briefly to FIG. 2, a simplified diagram of a neural network 200 is provided. The neural network 200 includes an input layer 210, a hidden layer 220, and an output layer 230. The input layer 210 receives those input values deemed appropriate for modeling the etch selectivity of the etch tool 130. In the illustrated embodiment, the incoming upper and underlying layer thickness measurements, as measured by the metrology tools 120, 140, are received as inputs, although other inputs may also be used. The hidden layer 220 "learns" the effects that recipe parameters in the operating recipe of the etch tool 130 have on determining the post-etch thicknesses of the underlying layer during a training procedure by which the neural network 200 is exposed to historical performance data of the etch tool 130 or a similar etch tool (not shown). The hidden layer 220 weights each of the inputs and/or combinations of the inputs to predict future performance. Through analysis of historical data, the weighting values are changed to try to increase the success at which the model predicts the future performance. The output layer 230 distills the manipulation of the hidden layer 220 to generate a prediction of, for example, the temperature, pressure, and/or reactant gas composition required to perform the etch and arrive at a target post-etch thickness for the underlying layer.

Once the model is sufficiently trained, it may be used in a production environment to predict the operation of etch tool 130 based on current input value measurements. Based on the results predicted by the neural network 200, the deposition control parameters are predicted, and the operating recipe of the etch tool 130 is modified accordingly. In the production environment, periodic measurements from the post-etch metrology tool 140 are provided as feedback to the process controller 150 for updating the etch selectivity model.

Figure 3:
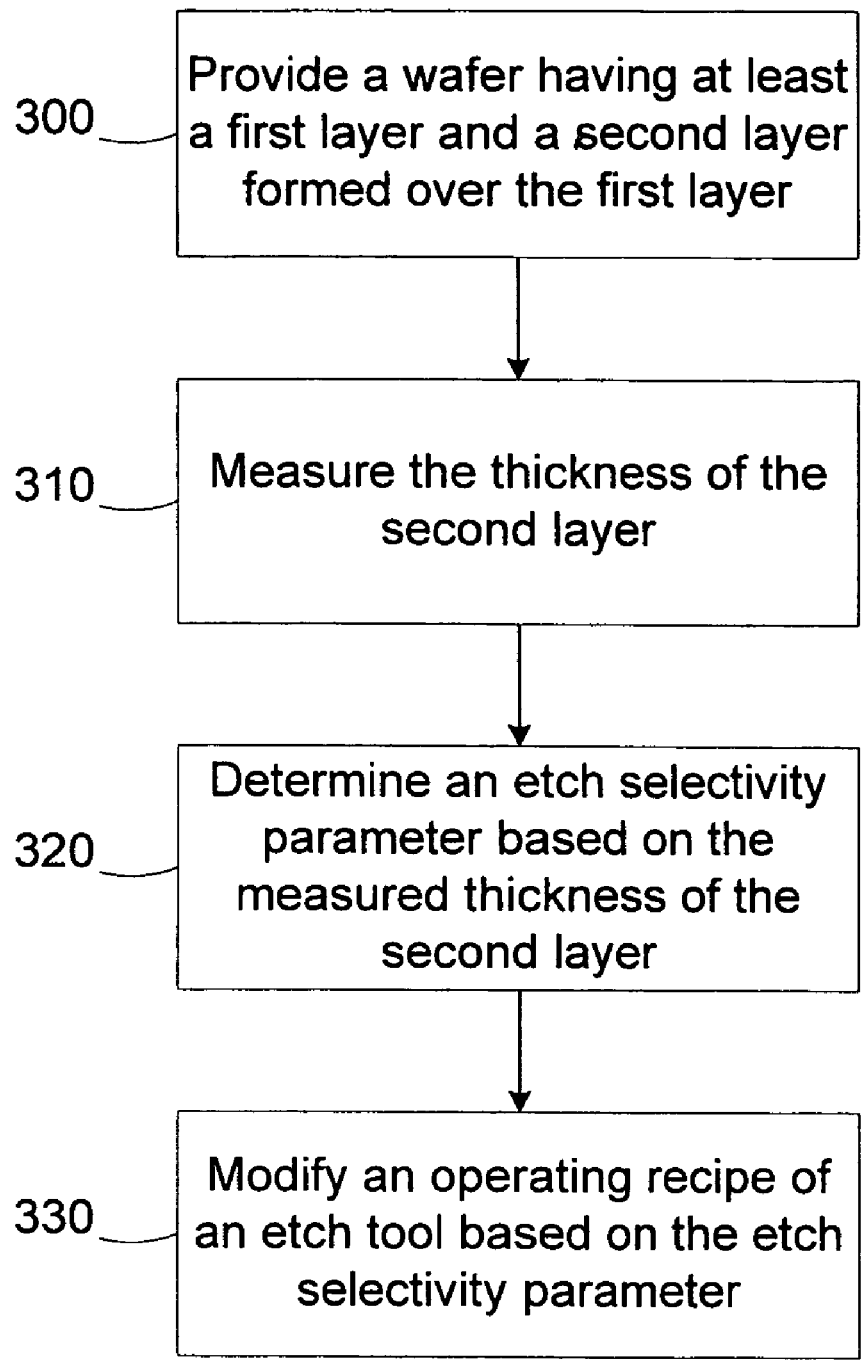
FIG. 3 is a simplified flow diagram of a method for decreasing variations in gate electrode lengths in accordance with one illustrative embodiment of the present invention.

Referring now to FIG. 3, a flow diagram of a method for controlling etch selectivity in an etch tool 130 is provided. In block 300, a wafer having first and second layers is provided. The second layer is formed over the first layer. The wafer is patterned to expose at least a portion of the second layer in block 310. In block 320, the thickness of the second layer is measured. In one embodiment, the thickness of the first layer may also be measured. In block 330, etch selectivity parameters are determined based on the thickness of the second layer (i.e., and based on the thickness of the first layer if so measured). Determining the etch selectivity parameters may be accomplished using a feedforward predictive modeling technique, or, alternatively using a feedback technique. In block 340, at least the first layer is etched based on the etch selectivity parameters. In the feedforward mode, the etching is performed for the current wafer. In the feedback mode, the etching is performed on subsequent wafers.

Controlling etch selectivity as described above reduces the post-etch thickness variations in the underlying layer, hence, giving rise to a more stable, repeatable process. By using real-time control models to effect the variation reduction, the throughput of the processing line 100 and the quality of the end product may be increased. Increased throughput and reduced variation lead directly to increased profitability.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for controlling an etch process, comprising:
   providing a wafer having at least a first layer and a second layer formed over the first layer;
   measuring a thickness of the second layer;
   providing a first operating recipe of an etch tool having a first etch selectivity;
   prior to etching the second layer, modifying the first operating recipe to generate a modified operating recipe having a second etch selectivity different than the first etch selectivity using an etch selectivity model that incorporates the measured thickness of the second layer to control the etch selectivity of the modified operating recipe; and etching at least the second layer based on the modified operating recipe.

2. The method of claim 1, further comprising measuring the thickness of the first layer, wherein modifying the first operating recipe comprises modifying the operating recipe based on the measured thickness of the first layer to provide the second etch selectivity different than the first etch selectivity.

3. The method of claim 1, wherein modifying the first operating recipe further comprises modifying a ratio of the concentrations of two reactive gases used in etching at least the second layer to provide the second etch selectivity different than the first etch selectivity.

4. The method of claim 3, wherein determining the ratio comprises determining a ratio of two halocarbon gases.

5. The method of claim 1, wherein modifying the first operating recipe further comprises modifying at least one of a temperature, a pressure, and a ratio of the concentrations of two reactive gases to provide the second etch selectivity different than the first etch selectivity.

6. The method of claim 1, further comprising etching at least a portion of the first layer based on the modified operating recipe.

7. The method of claim 6, further comprising:
measuring the thickness of a remaining portion of the first layer;
comparing the measured thickness of the remaining portion to a target thickness; and
modifying the first operating recipe of the etch tool based on a difference between the measured thickness of the remaining portion and the target thickness to provide the second etch selectivity different than the first etch selectivity.

8. The method of claim 1 further comprising:
etching at least a portion of the second layer based on the modified operating recipe;
etching at least a portion of the first layer based on the modified operating recipe;
measuring the thickness of a remaining portion of the first layer; and
updating the etch selectivity model based on the measured thickness of the remaining portion of the first layer.

9. The method of claim 1, wherein modifying the first operating recipe includes generating the modified operating recipe for a current wafer.

10. The method of claim 1, further comprising processing subsequent wafers using the modified operating recipe.

11. The method of claim 1, wherein the first and second etch selectivities relate to relative etch rates of the first and second layers.

12. The method of claim 1, wherein the first and second etch selectivities relate to relative etch rates of the second layer and a byproduct generated during the etching of the second layer.

13. A method for controlling an etch process, comprising:
providing a wafer having at least a first layer and a second layer formed over the first layer;
providing a first operating recipe of an etch tool having a first etch selectivity;
measuring the thicknesses of the first and second layers;
prior to etching the second layer, modifying the first operating recipe to generate a modified operating recipe having a second etch selectivity different than the first etch selectivity using an etch selectivity model that incorporates the measured thicknesses of the first and second layers to control the etch selectivity of the modified operating recipe; and
etching the second layer and at least a portion of the first layer based on the modified operating recipe.

14. The method of claim 13, wherein modifying the first operating recipe further comprises modifying a ratio of the concentrations of two reactive gases used in etching at least the second layer to provide the second etch selectivity different than the first etch selectivity.

15. The method of claim 14, wherein determining the ratio comprises determining a ratio of two halocarbon gases.

16. The method of claim 13, wherein modifying the first operating recipe further comprises modifying at least one of a temperature, a pressure, and a ratio of the concentrations of two reactive gases to provide the second etch selectivity different than the first etch selectivity.

17. The method of claim 13, further comprising:
measuring the thickness of a remaining portion of the first layer;
comparing the measured thickness of the remaining portion to the predicted post-etch thickness; and
modifying the first operating recipe based on a difference between the measured thickness of the remaining portion and the predicted post-etch thickness to provide the second etch selectivity different than the first etch selectivity.

18. The method of claim 13, wherein modifying the operating recipe includes updating the operating recipe for a current wafer.

19. The method of claim 13, further comprising processing subsequent wafers using the modified operating recipe.

20. The method of claim 13, wherein the first and second etch selectivities relate to relative etch rates of the first and second layers.

21. The method of claim 13, wherein the first and second etch selectivities relate to relative etch rates of the second layer and a byproduct generated during the etching of the second layer.

* * * * *